(12) United States Patent
Lee

(10) Patent No.: US 6,181,265 B1
(45) Date of Patent: Jan. 30, 2001

(54) NON-LINEAR DIGITAL-TO-ANALOG CONVERTER

(75) Inventor: Won Kee Lee, Kyongsangbuk-do (KR)

(73) Assignee: LG Semicon Co., Ltd., Chungcheongbuk-Do (KR)

(*) Notice: Under 35 U.S.C. 154(b), the term of this patent shall be extended for 0 days.

(21) Appl. No.: 09/285,455

(22) Filed: Apr. 2, 1999

(30) Foreign Application Priority Data

Aug. 18, 1998 (KR) .................................................. 98/33511

(51) Int. Cl.[7] .................................................. H03M 1/68
(52) U.S. Cl. .......................... 341/145; 341/154; 341/138
(58) Field of Search .................................... 341/136, 145, 341/154, 138

(56) References Cited

U.S. PATENT DOCUMENTS

| | | | |
|---|---|---|---|
| 4,918,448 | 4/1990 | Hauviller et al. ..................... | 341/145 |
| 5,059,978 | * 10/1991 | Valdenaire ........................... | 341/145 |
| 5,495,245 | 2/1996 | Ashe .................................... | 341/145 |
| 5,648,780 | * 7/1997 | Neidorff ............................... | 341/154 |
| 5,999,115 | * 12/1999 | Connell et al. ....................... | 341/145 |

* cited by examiner

Primary Examiner—Howard L. Williams
(74) Attorney, Agent, or Firm—Morgan, Lewis & Bockius LLP

(57) ABSTRACT

A non-linear digital-to-analog converter is disclosed, which realizes non-linear output with overlapped resistor string. The non-linear digital-to-analog converter includes a first reference voltage select switching portion for selectively outputting first and second reference voltages Vh1 and Vc1 from externally applied reference voltages Vref[1, ... $2^{N/2}$] and third and fourth reference voltages Vh2 and Vc2 from externally applied reference voltages Vref[0, ... $2^{N/2}-1$] if N bit digital value is input, a resistor string block for outputting Vh[0, ... $2^{N/2}-1$] number of level voltages, Vc[0, ... $2^{N/2}-1$] number of level voltages, and V1[0, ... $2^{N/2}-1$] number of level voltages from any one of the reference voltages Vh1 and Vc1 and any one of the reference voltages Vh2 and Vc2, a second reference voltage select switching portion for outputting a first analog conversion voltage V1 from the Vh[0, ... $2^{N/2}-1$] number of level voltages, a second analog conversion voltage V2 from the Vc[0, ... $2^{N/2}-1$] number of level voltages, and a third analog conversion voltage V3 from the V1[0, ... $2^{N/2}-1$] number of level voltages, and an output switching portion for selectively outputting any one of the first, second and third analog conversion voltages V1, V2 and V3.

7 Claims, 9 Drawing Sheets

First reference voltage first
select switching portion 21

First reference voltage second
select switching portion 22

Resistor string Block 23

Second reference Voltage
first select switching portiion 24

Second reference voltage
second select switching portion 25

Second reference voltage
third select switching portion 26

Output switching portion 27

NON-LINEAR DIGITAL-TO-ANALOG CONVERTER

BACKGROUND OF THE INVENTION

1. Field of the Invention

The present invention relates to a digital-to-analog converter, and more particularly, to a non-linear digital-to-analog converter which realizes non-linear output with overlapped resistor string.

2. Discussion of the Related Art

Generally, industrial systems and controllers have trends to digitalization with the spread of CPUs having fast speed in an analog circuit at suitable cost. Most of industrial systems and controllers share digital mode with analog mode. In this respect, for signal transmission between digital mode and analog mode, an analog-to-digital converter or a digital-to-analog converter is required.

An analog-to-digital converter is used in the field of instrumentation and control. With the development of microcomputers, parts processed by analog mode have been processed by converting an analog signal to a digital signal using the analog-to-digital converter. For this reason, reliability and efficiency of applied products have improved.

A background art digital-to-analog converter will be described with reference to the accompanying drawings.

FIGS. 1a and 1b are schematic diagrams illustrating a background art digital-to-analog converter.

As shown in FIG. 1a, the background art digital-to-analog converter includes a primary resistor string 1, most significant bit (MSB) switching block 2, least significant bit (LSB) switching block 3, a secondary resistor string 4, and LSB output switching portion 5.

Two voltages formed in succession between V2 and V1 are applied between M1~M7 of the primary resistor string 1 using the MSB switching block 2 and the LSB switching block 3. One voltage is output through the LSB output switching portion 5.

As shown in FIG. 1b, the background art digital-to-analog converter includes a primary resistor string 6 consisting of $Ra1 \sim Ra2^{N/2}-1$, a first switching block 7 consisting of $Sa1 \sim Sa2^{N/2}1$, a secondary resistor string 8 consisting of $Rb1 \sim Rb2_{N/2}-1$, a second switching block 9 consisting of $Sb1 \sim Sb2^{N/2}-1$, a cubic resistor string 10 consisting of $Rc1 \sim Rc2^{N/2}-1$, and a third switching block 11 consisting of $Sc1 \sim Sc2^{N/2}-1$.

In the aforementioned digital-to-analog converter, resistor ratio of Ra, Rb and Rc is $2^{N/2}:2^{N/2}:1$ and a total of resistor string selected by the MSB plus resistor string selected by the LSB is $2^{the\ number\ of\ MSB} * 2^{N/2}$ of Rc.

In other words, among 6 bits, when high 3 bits are the MSB and low 3 bits are the LSB, Ra is $2*2^3$ times (8–101$_{(2)}$–1) of Rc in case of 101010$_{(2)}$. At this time, Rb is $5*2^3$ times (101$_{(2)}$). Since Rc is always $2^3$, total resistor value is $8*2^3$ times ($2^3 * 2^3$).

If the value of 010$_{(2)}$ is selected by Sc of the third switching block 11, it is possible to wholly select the value of 101010$_{(2)}$.

The aforementioned background art digital-to-analog converter has several problems.

First, since the secondary resistor string is always fixed at a uniform value, it can be applied to the digital-to-analog converter which outputs linear value. However, it cannot be used in apparatuses which require non-linear value. In addition, the resistor value may be greater than a desired resistor value due to on-resistor constituting each switching block. This causes incorrect conversion value.

SUMMARY OF THE INVENTION

Accordingly, the present invention is directed to a non-linear digital-to-analog converter that substantially obviates one or more of the problems due to limitations and disadvantages of the related art.

An object of the present invention is to provide a non-linear digital-to-analog converter which realizes non-linear output with overlapped resistor string.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a non-linear digital-to-analog converter according to the present invention includes a first reference voltage select switching portion for selectively outputting first and second reference voltages Vh1 and Vc1 from externally applied reference voltages Vref[1, ... $2^{N/2}$] and third and fourth reference voltages Vh2 and Vc2 from externally applied reference voltages Vref[0, ... $2^{N/2}-1$] if N bit digital value is input, a resistor string block for outputting Vh[0, ... $2^{N/2}-1$] number of level voltages, Vc[0, ... $2^{N/2}-1$] number of level voltages, and V1[0, ... $2^{N/2}-1$] number of level voltages from any one of the reference voltages Vh1 and Vc1 and any one of the reference voltages Vh2 and Vc2, a second reference voltage select switching portion for outputting a first analog conversion voltage V1 from the Vh[0, ... $2^{N/2}-1$] number of level voltages, a second analog conversion voltage V2 from the Vc[0, ... $2^{N/2}-1$) number of level voltages, and a third analog conversion voltage V3 from the V1[0, ... $2^{N/2}-1$] number of level voltages, and an output switching portion for selectively outputting any one of the first, second and third analog conversion voltages V1, V2 and V3.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
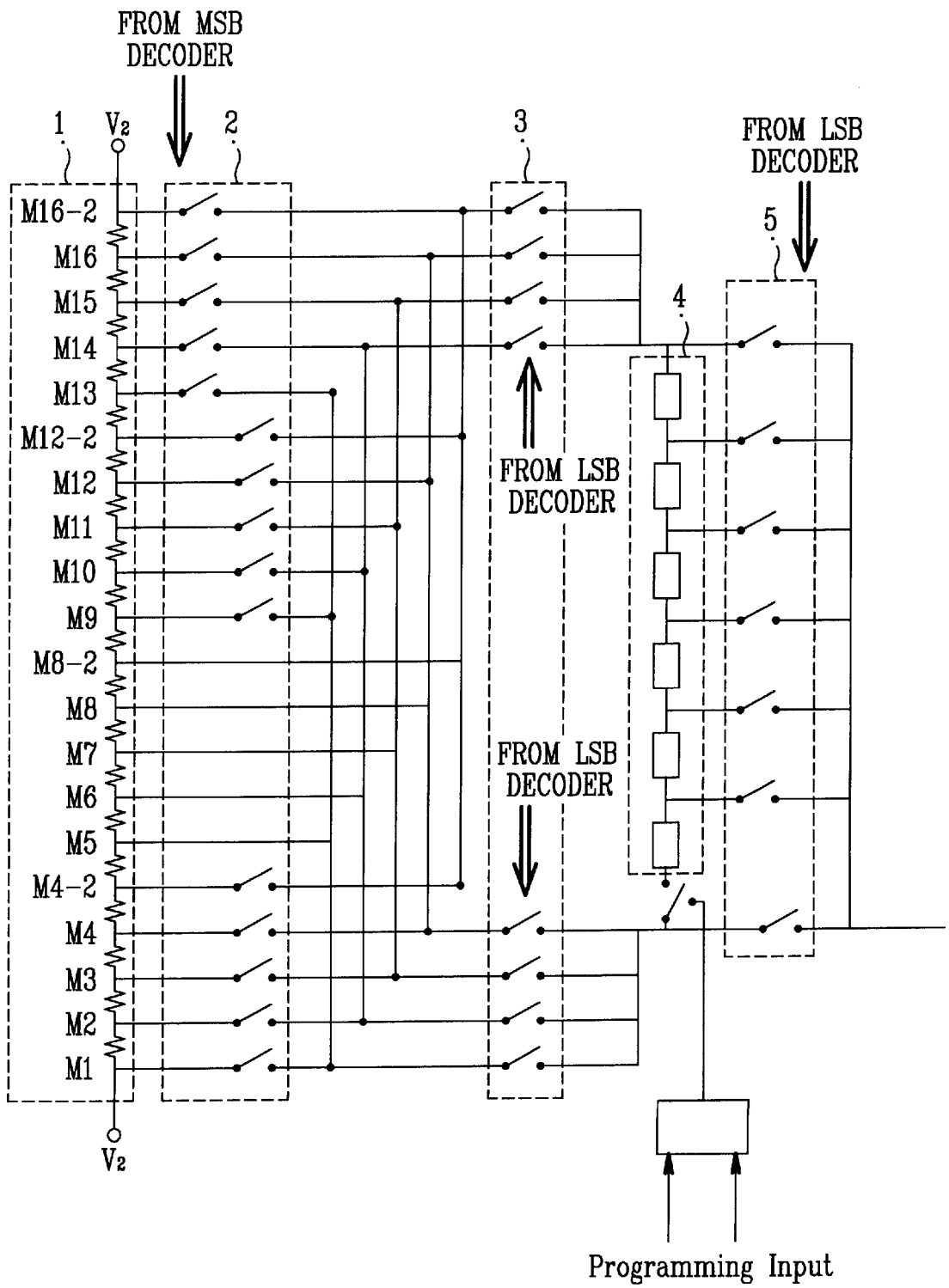
FIGS. 1a and 1b are schematic views illustrating a background art digital-to-analog converter.
Figure 1B:
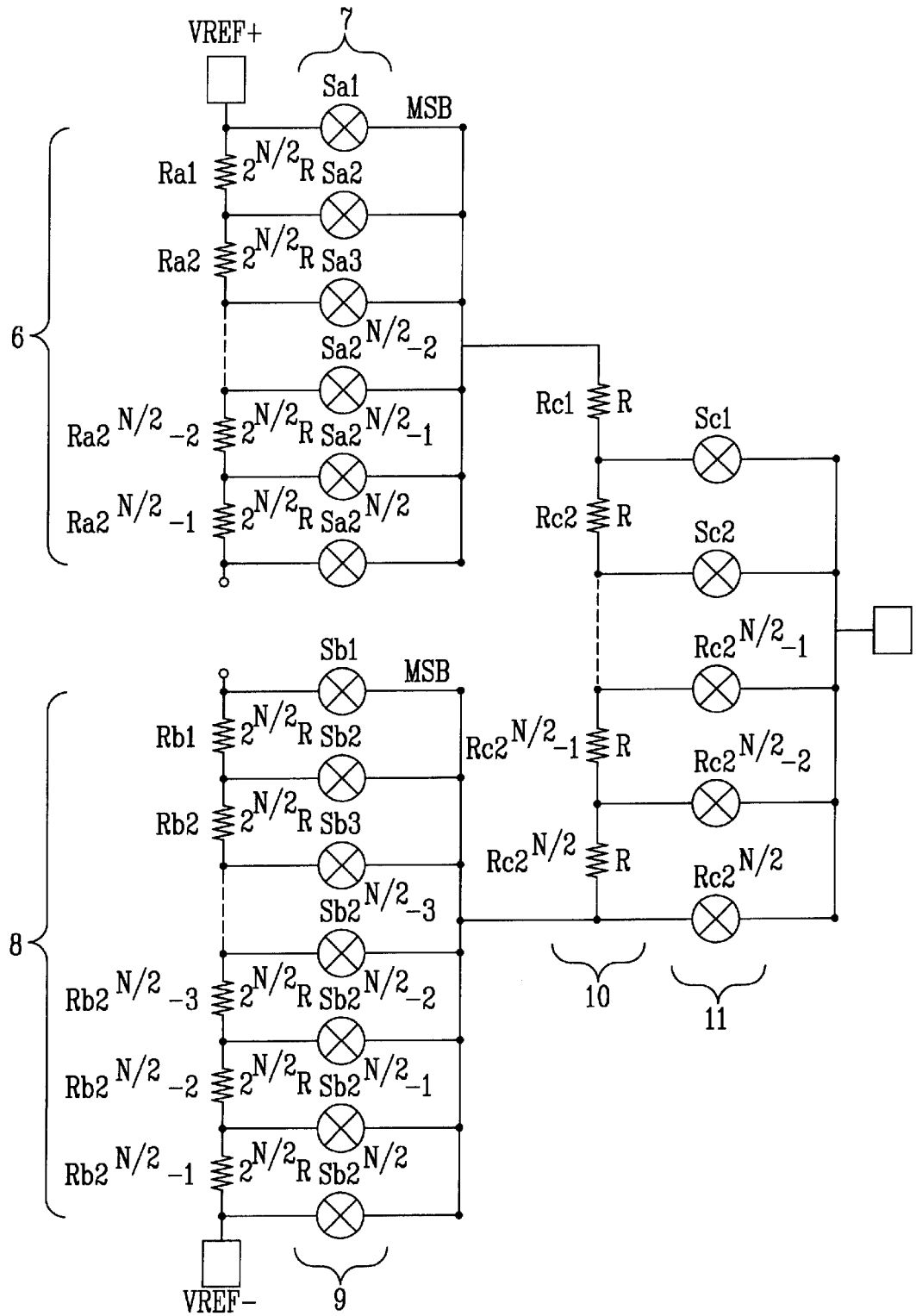
Figure 2:
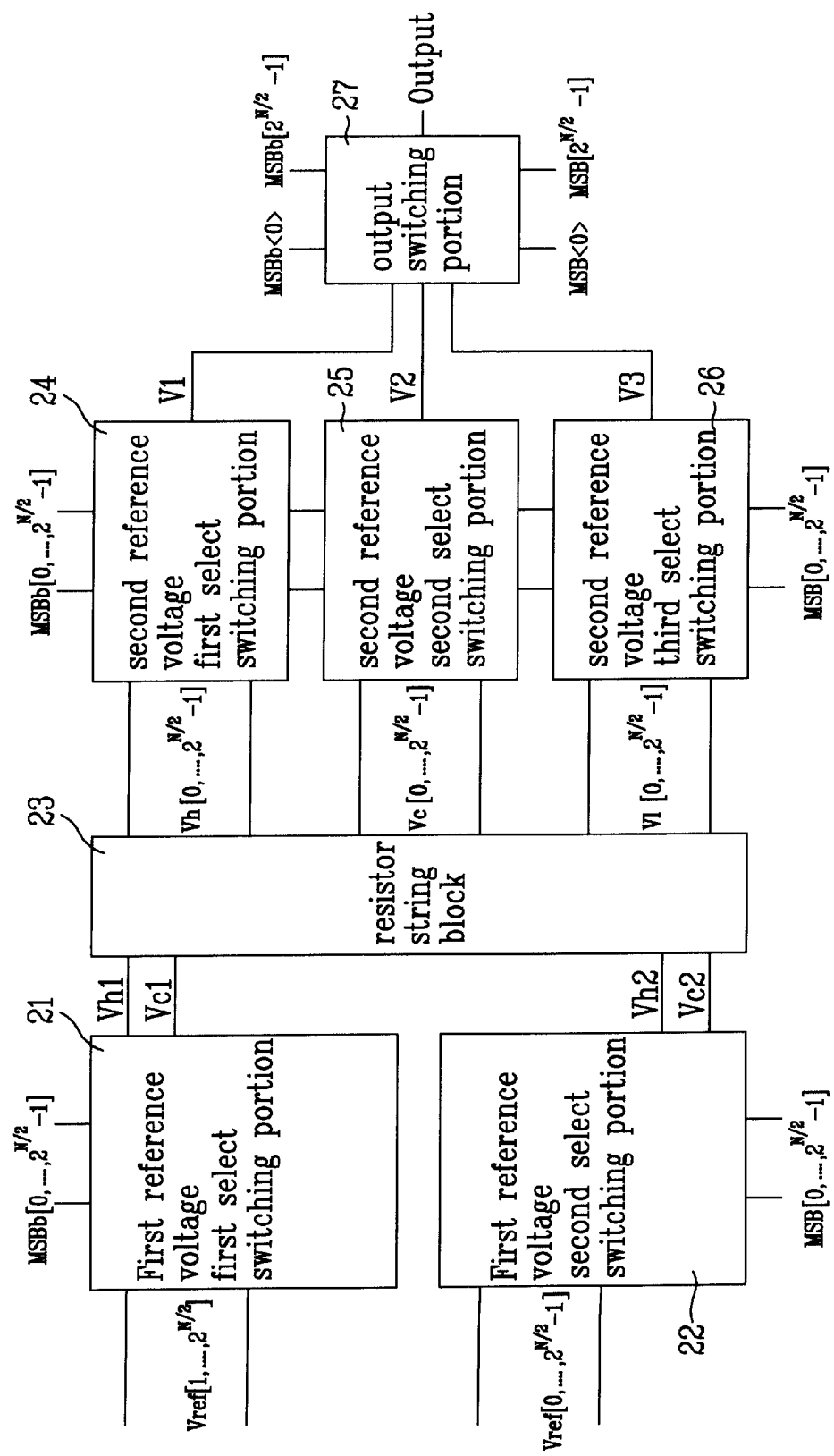
FIG. 2 is a block diagram illustrating a non-linear digital-to-analog converter according to the present invention.

FIG. 2 is a block diagram illustrating a non-linear digital-to-analog converter according to the present invention.

A digital-to-analog converter of the present invention is intended that non-linear output is available with a small number of resistors.

The non-linear digital-to-analog converter according to the present invention includes a first reference voltage first select switching portion 21 for outputting reference voltages Vh1 and Vc1 from externally applied reference voltages Vref1, ... $2^{N/2}$] for analog conversion of N bit digital value and MSBb[0, ... $2^{N/2}-1$] signal, a first reference voltage second select switching portion 22 for outputting reference voltages Vh2 and Vc2 from externally applied reference voltages Vref[0, ... $2^{N/2}-1$] and MSB[0, ... $2^{N/2}-1$] signal, a resistor string block 23 for outputting Vh[0, ... $2^{N/2}-1$] number of level voltages, Vc[0, ... $2^{N/2}-1$] number of level voltages, and V1[0, ... $2^{N/2}-1$] number of level voltages from any one of the reference voltages Vh1 and Vc1 and any one of the reference voltages Vh2 and Vc2, a second reference voltage first select switching portion 24 for outputting a first analog conversion voltage V1 from the Vh[0, ... $2^{N/2}-1$] number of level voltages and LSBb[0, ... $2^{N/2}-1$], a second reference voltage second select switching portion 25 for outputting a second analog conversion voltage V2 from the Vc[0, ... $2^{N/2}-1$] number of level voltages, LSBb[0, ... $2^{N/2}-1$], and LSB[0, ... $2^{N/2}-1$], a second reference voltage third select switching portion 26 for outputting a third analog conversion voltage V3 from the V1[0, ... $2^{N/2}-1$] number of level voltages and LSB[0, ... $2^{N/2}-1$], and an output switching portion 27 for selectively outputting any one of the first, second and third analog conversion voltages V1, V2 and V3 by combination of MSBb<0>, MSBb<$2^{N/2}-1$>, MSB<0>, and MSB<$2^{N/2}-1$>.

The aforementioned non-linear digital-to-analog converter will now be described in detail.

Figure 3:
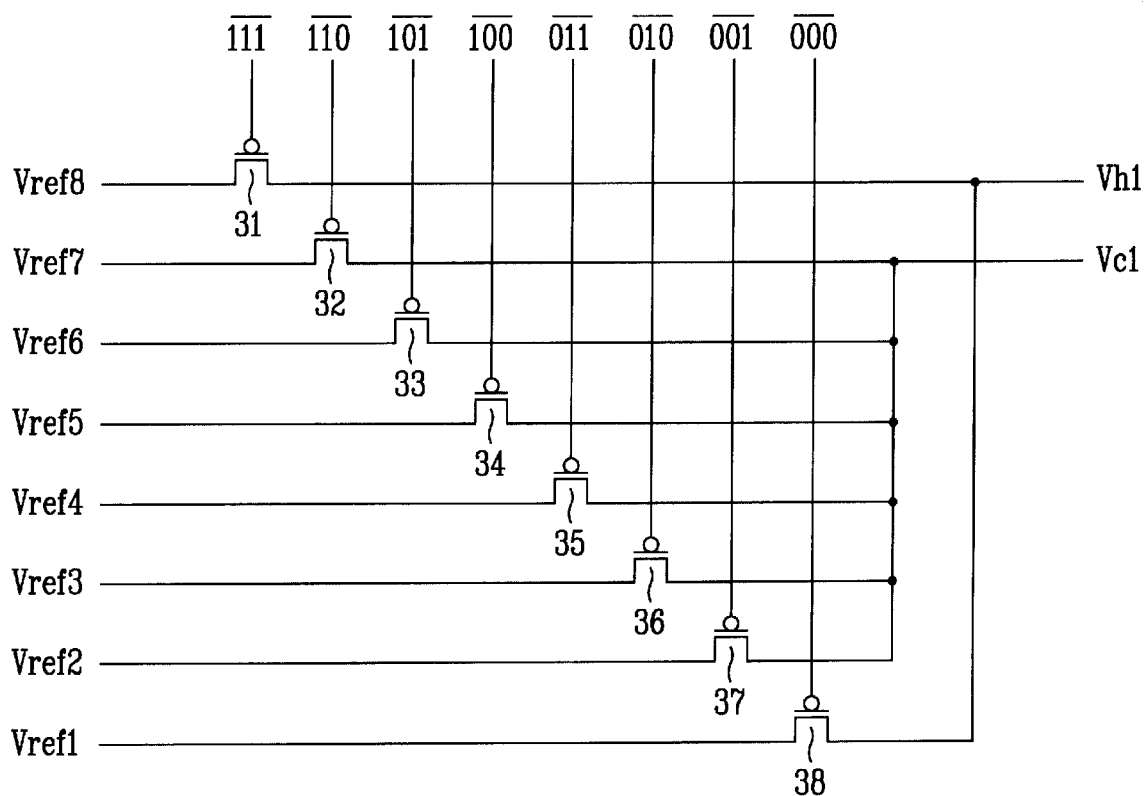
FIG. 3 is a detailed schematic view illustrating a first reference voltage first select switching portion of a non-linear digital-to-analog converter according to the present invention.
Figure 4:
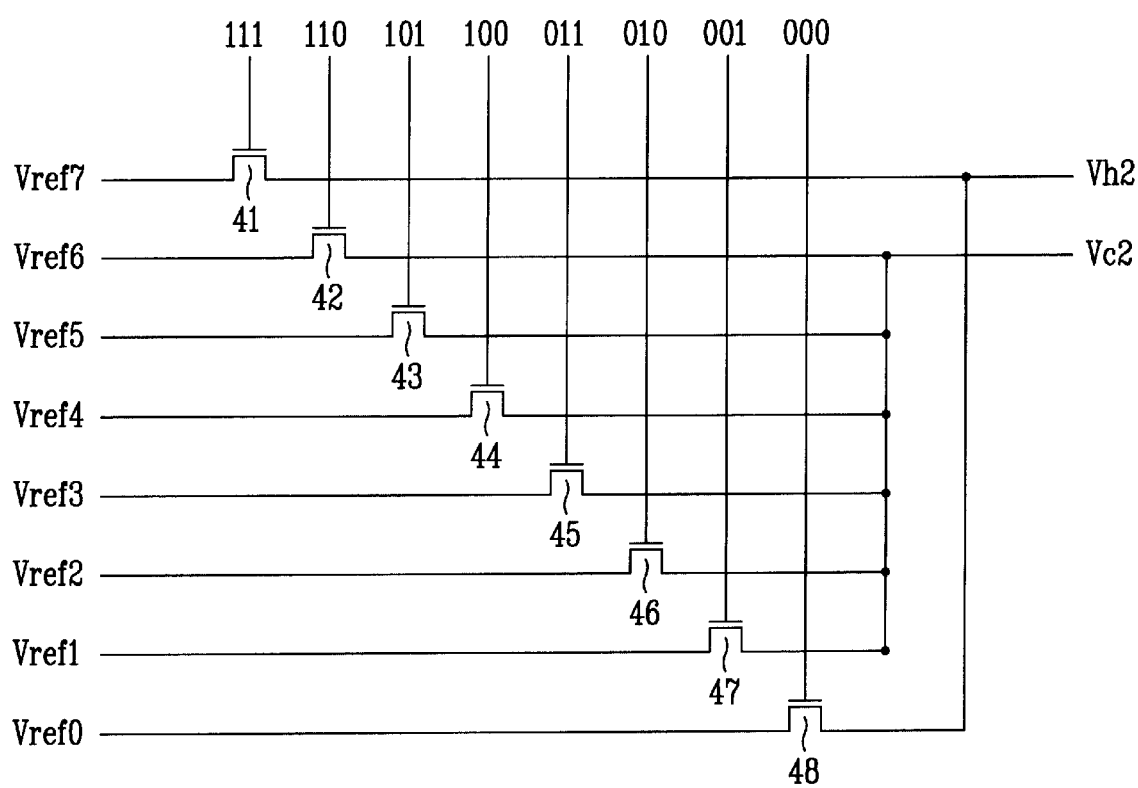
FIG. 4 is a detailed schematic view illustrating a first reference voltage second select switching portion of a non-linear digital-to-analog converter according to the present invention.

First, the first reference voltage first select switching portion and the first reference voltage second select switching portion will be described in detail with reference to FIGS. 3 and 4. In the present invention, conversion input value is 6 bits (N=6).

The first reference voltage first select switching portion 21 includes first, second, third, fourth, fifth, sixth, seventh and eighth PMOS transistors 31, 32, 33, 34, 35, 36, 37 and 38 turned on depending on which one of input signals MSBb[0, ... , $2^{N/2}-1$], i.e., any one of input data /111, /110, /101, /100, /011, /010, /001, /000 is input, for respectively switching reference voltages of Vref[1, ... , $2^{N/2}$], i.e., Vref8, Vref7, Vref6, Vref5, Vref4, Vref3, Vref2, Vref1 of different levels.

In this case, one of the reference voltages Vref8 and Vref1 respectively output from the first PMOS transistor 31 and the eighth PMOS transistor 38 which are respectively turned on by the input data /111 and /000 is output as a conversion voltage Vh1 corresponding to high bit. Alternatively, any one of the reference voltages Vref7, Vref6, Vref5, Vref4, Vref3 and Vref2 output from the second to seventh PMOS transistors 32, 33, 34, 35, 36 and 37 which are turned on by the input data /110, /101, /100, /011, /010 and /001 is output as a conversion voltage Vc1 corresponding to high common bit.

The first reference voltage second select switching portion 22 includes first, second, third, fourth, fifth, sixth, seventh and eighth NMOS transistors 41, 42, 43, 44, 45, 46, 47 and 48 turned on depending on which one of input signals MSB[0, ... , $2^{N/2}-1$], i.e., any one of input data 111, 110, 101, 100, 011, 010, 001, 000 is input, for respectively switching reference voltages of Vref[1, ... , $2^{N/2}-1$], i.e., Vref7, Vref6, Vref5, Vref4, Vref3, Vref2, Vref1 and Vref0 of different levels.

In this case, one of the reference voltages Vref7 and Vref1 respectively output from the first NMOS transistor 41 and the eighth NMOS transistor 48 which are turned on by the input data 111 and 000, respectively, is output as a conversion voltage Vh2 corresponding to high bit. Alternatively, any one of the reference voltages Vref6, Vref5, Vref4, Vref3, Vref2 and Vref1 output from the second, third, fourth, fifth, sixth and seventh NMOS transistors 42, 43, 44, 45, 46 and 47 which are turned on by the input data 110, 101, 100, 011, 010 and 001 is output as a conversion voltage Vc2 corresponding to high common bit.

The resistor string block of the non-linear digital-to-analog converter will be described in detail with reference to FIG. 5.

Figure 5:
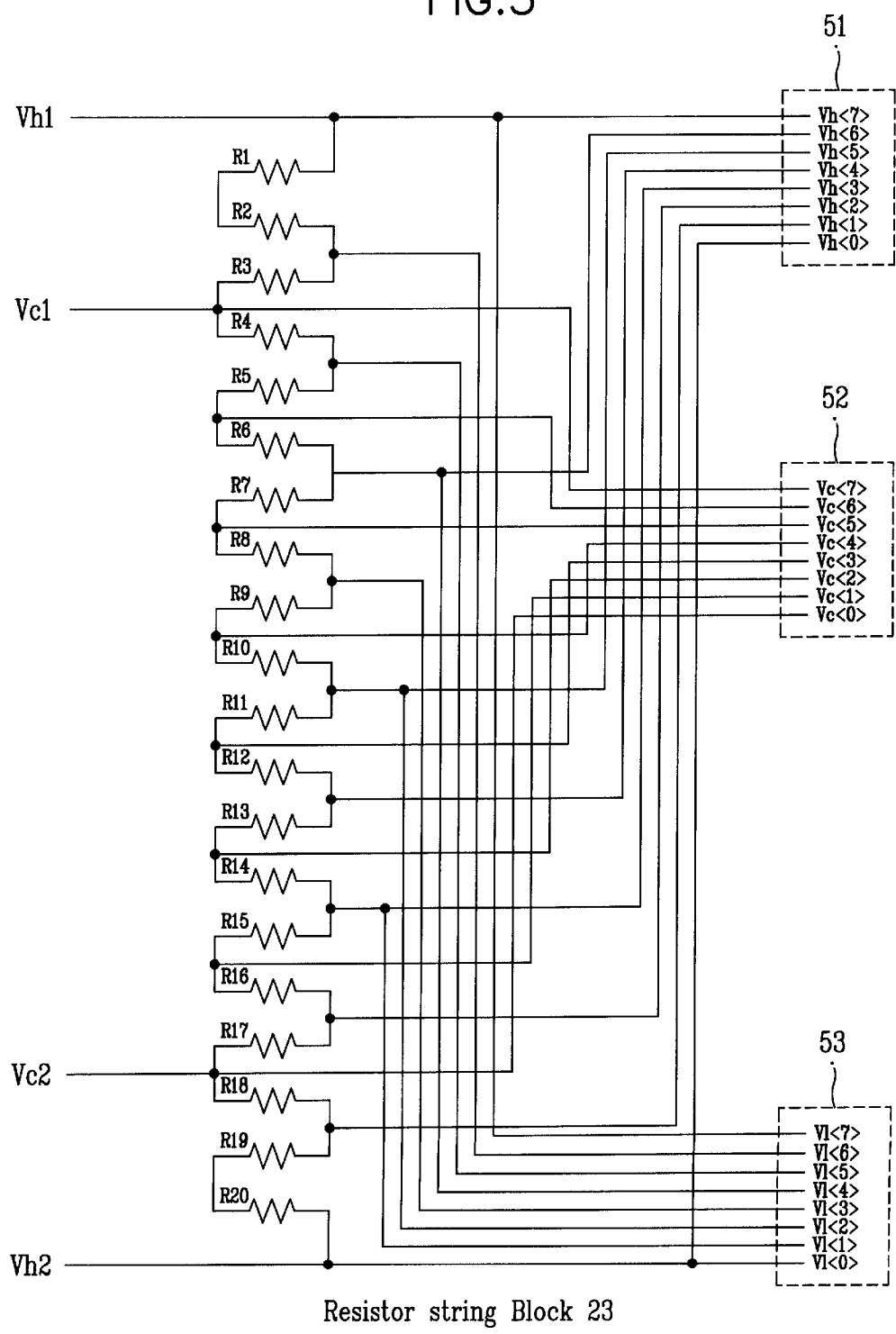
FIG. 5 is a detailed schematic view illustrating a resistor string block of a non-linear digital-to-analog converter according to the present invention.

As shown in FIG. 5, Vh1 of the voltages Vh1, Vc1, Vh2 and Vc2 output from the first reference voltage first select switching portion 21 and the first reference voltage second select switching portion 22 and its counterpart voltage Vh2 are input to the resistor string block 23. Alternatively, Vc1 and its counterpart voltage Vc2 are input to the resistor string block 23.

The resistor string block 23 includes a plurality of resistors R1~R20 connected in series, a first reference voltage first output terminal 51, a first reference voltage second output terminal 52, and a first reference voltage third output terminal 53. Output lines are formed between each of the resistors R1~R20 to divide input voltage into $2^{N/2}$. The output lines consist of Vh[0, ... , $2^{N/2}-1$], Vc[0, ... , $2^{N/2}-1$], and V1[0, ... , $2^{N/2}-1$].

Each output line of the first reference voltage first output terminal 51 consisting of Vh[0, ... , $2^{N/2}-1$] number of output lines will be described below.

In other words, the output line of Vh<7> is directly connected to the output line Vh1 of the first reference voltage first select switching portion 21 not through the resistor. The output line of Vh<6> is connected between the resistor R6 and the resistor R7. The output line of Vh<5> is connected between the resistor R10 and the resistor R11, the output line of Vh<4> is connected between the resistor R12 and the resistor R13, the output line of Vh<3> is connected between the resistor R14 and the resistor R15, the output line of Vh<2> is connected between the resistor R16 and the resistor R17, and the output line of Vh<1> is connected between the resistor R18 and the resistor R19. The output line of Vh<0> is directly connected to the output line Vh2 of the first reference voltage second select switching portion 22 not through the resistor.

Each output line of the first reference voltage second output terminal 52 consisting of Vc[0, . . . $2^{N/2}-1$] number of output lines will be described below.

In other words, the output line of Vc<7> is directly connected to the output line Vc1 of the first reference voltage first select switching portion 21 not through the resistor. The output line of Vc<6> is connected between the resistor R5 and the resistor R6. The output line of Vc<5> is connected between the resistor R7 and the resistor R8, the output line of Vc<4> is connected between the resistor R9 and the resistor R10, the output line of Vc<3> is connected between the resistor R11 and the resistor R12, the output line of Vc<2> is connected between the resistor R13 and the resistor R14, and the output line of Vc<1> is connected between the resistor R15 and the resistor R16. The output line of Vc<0> is directly connected to the output line Vc2 of the first reference voltage second select switching portion 22 not through the resistor.

Each output line of the first reference voltage third output terminal 53 consisting of Vl[0, . . . , $2^{N/2}-1$] number of output lines will be described below.

In other words, the output line of Vl<7> is directly connected to the output line Vh1 of the first reference voltage first select switching portion 21 not through the resistor. The output line of Vl<6> is connected between the resistor R2 and the resistor R3. The output line of Vl<5> is connected between the resistor R4 and the resistor RS, the output line of Vl<4> is connected between the resistor R6 and the resistor R7, the output line of Vl<3> is connected between the resistor R8 and the resistor R9, the output line of Vl<2> is connected between the resistor R10 and the resistor R11, and the output line of Vl<1> is connected between the resistor R14 and the resistor R15. The output line of Vl<0> is directly connected to the output line Vh2 of the first reference voltage second select switching portion 22 not through the resistor.

The second reference voltage first, second and third select switching portions will be described in detail with reference to FIGS. 6 to 8.

Figure 6:
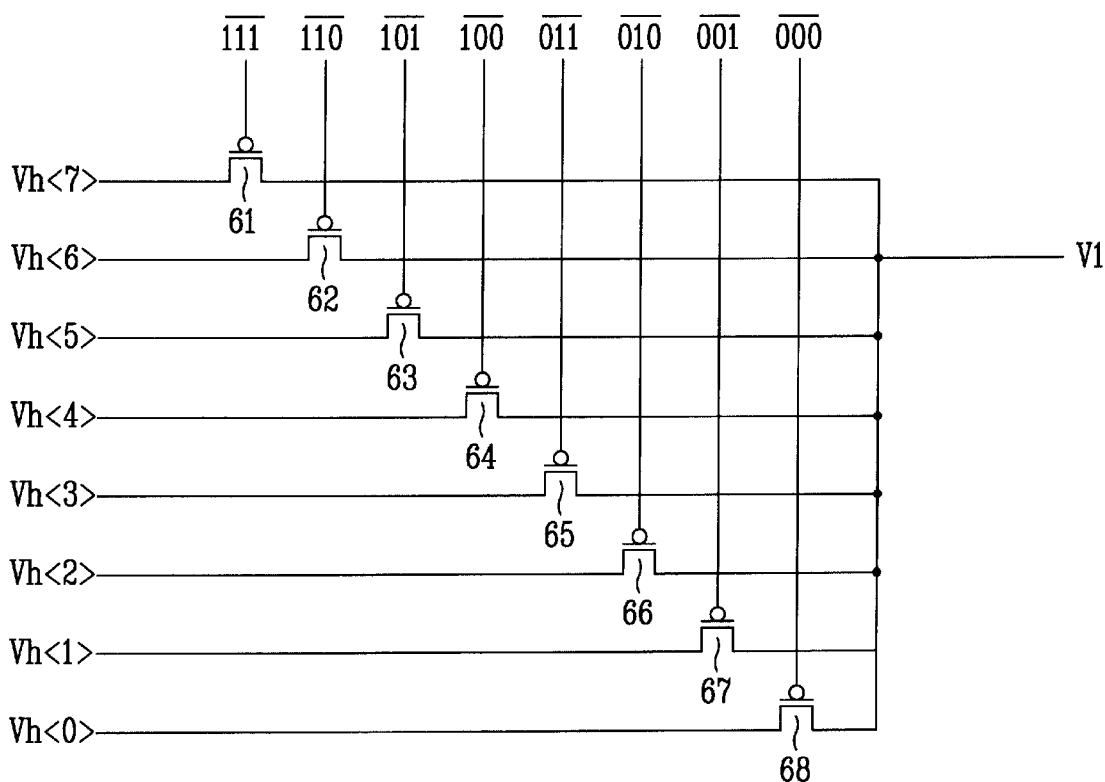
FIG. 6 is a detailed schematic view illustrating a second reference voltage first select switching portion of a non-linear digital-to-analog converter according to the present invention.

As shown in FIG. 6, the second reference voltage first select switching portion 24 includes first, second, third, fourth, fifth, sixth, seventh and eighth PMOS transistors 61, 62, 63, 64, 65, 66, 67 and 68 turned on depending on which one of input signals LSBb[0, . . . , $2^{N/2}-1$], i.e., any one of low bit data /111, /110, /101, /100, /011, /010, /001, /000 is input, for respectively selecting any one of output values Vh[0, . . . , $2^{N/2}-1$] output from the resistor string block 23 and outputting it as a first analog conversion voltage V1.

Figure 7:
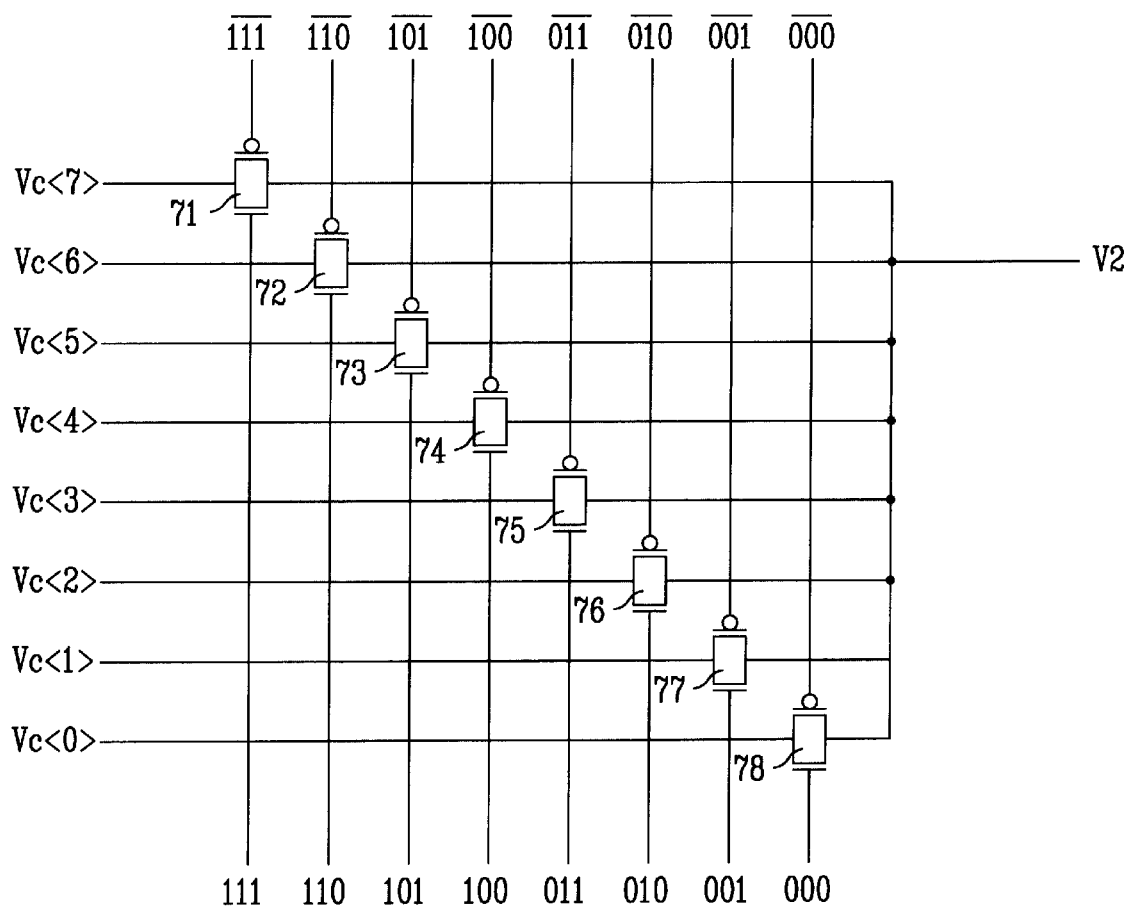
FIG. 7 is a detailed schematic view illustrating a second reference voltage second select switching portion of a non-linear digital-to-analog converter according to the present invention.

As shown in FIG. 7, the second reference voltage second select switching portion 25 includes first to eighth transmission gates 71, 72, 73, 74, 75, 76, 77 and 78 turned on depending on which data of input signals LSBb[0, . . . , $2^{N/2}-1$], i.e., any one of low bit data /111, /110, /101, /100, /011, /010, /001, /000 and their counterpart data LSB[0, . . . , $2^{N/2}-1$], i.e., 111, 110, 101, 100, 011, 010, 001, 000 is input, for respectively selecting any one of output values Vc[0 , . . . , $2^{N/2}-1$] output from the resistor string block 23 and outputting it as a second analog conversion voltage V2.

Figure 8:
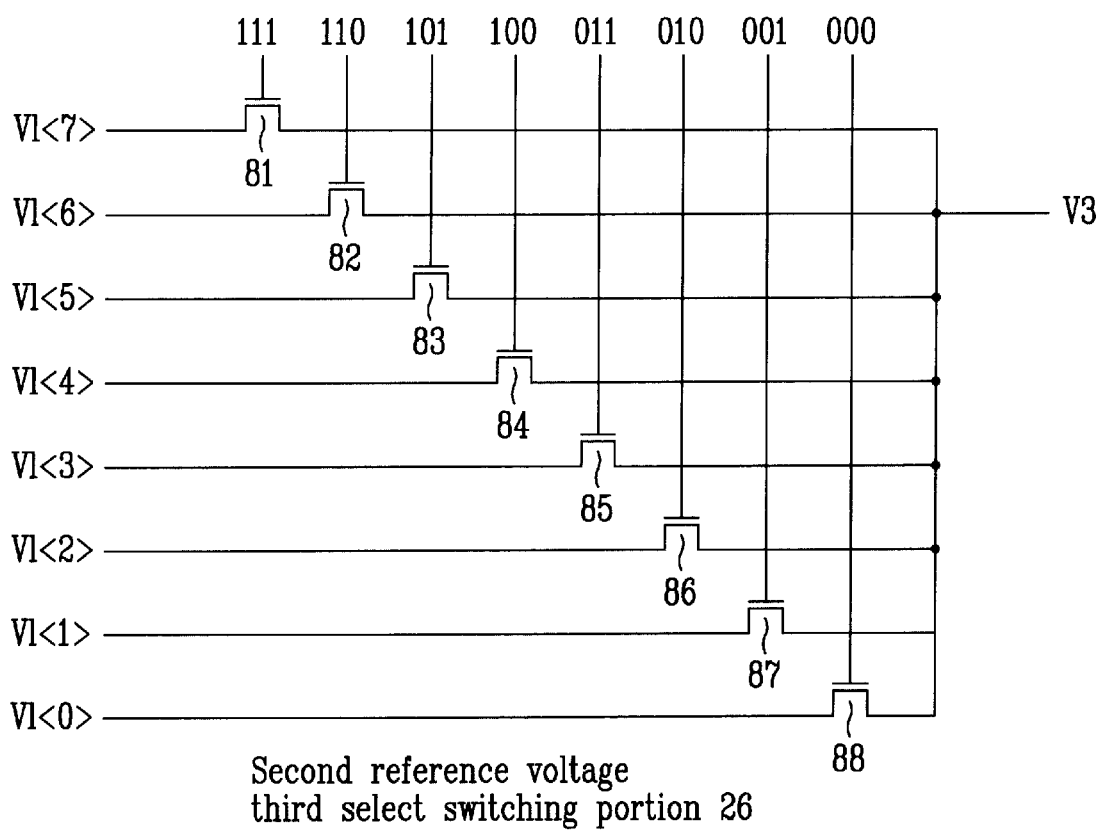
FIG. 8 is a detailed schematic view illustrating a second reference voltage third select switching portion of a non-linear digital-to-analog converter according to the present invention.

Further, as shown in FIG. 8, the second reference voltage third select switching portion 26 includes first to eighth NMOS transistors 61, 62, 63, 64, 65, 66, 67 and 68 turned on depending on which data of input signals LSB[0, . . . , $2^{N/2}-1$], i.e., any one of low bit data 111, 110, 101, 100, 011, 010, 001, 000 is input, for respectively selecting any one of output values Vl[0, . . . , $2^{N/2}-1$] output from the resistor string block 23 and outputting it as a third analog conversion voltage V3.

The output switching portion of the non-linear digital-to-analog converter according to the present invention will be described with reference to FIG. 9.

Figure 9:
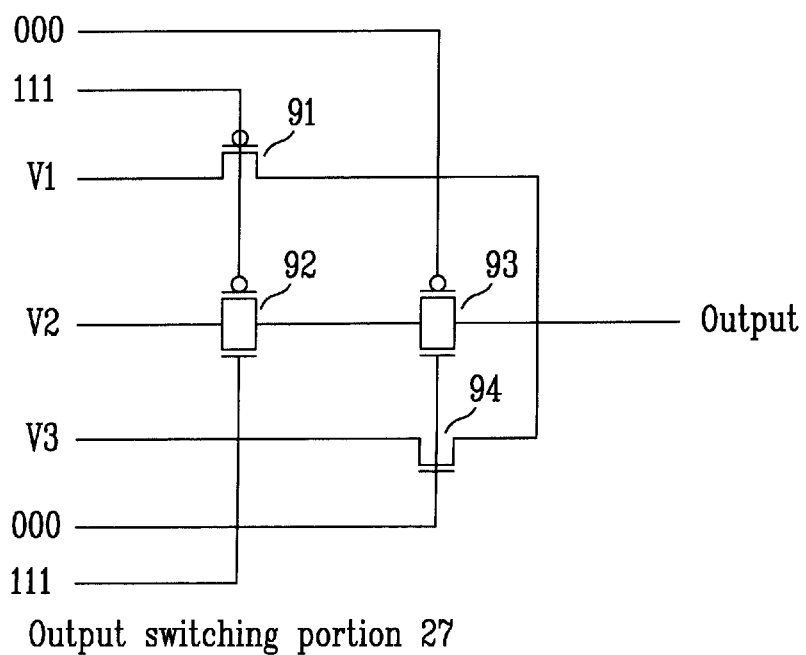
FIG. 9 is a detailed schematic view illustrating an output switching portion of a non-linear digital-to-analog converter according to the present invention.

As shown in FIG. 9, the output switching portion includes a PMOS transistor 91 selectively turned on/off by MSBb<$2^{N/2}-1$> applied to the gate, for selectively outputting the first analog conversion voltage V1, a first transmission gate 92 selectively turned on/off by MSBb<$2^{N/2}-1$> applied to the gate of the PMOS transistor and MSB<$2^{N/2}-1$> applied to the gate of the NMOS transistor, for selectively outputting the second analog conversion voltage V2, a second transmission gate 93 connected to an output terminal of the first transmission gate 92, for selectively outputting an output signal of the first transmission gate 92 by MSBb<0> applied to the gate of the PMOS transistor and MSB<0> applied to the gate of the NMOS transistor, and an NMOS transistor 94 turned on/off by MSB<0> applied to the gate, for selectively outputting the third analog conversion voltage V3.

The analog conversion operation of the aforementioned non-linear digital-to-analog converter will be described below.

Vh1 or Vc1 is selected from the Vref[1, . . . , $2^{N/2}-1$] input by MSBb[0, . . . , $2^{N/2}-1$] signals and output through the first reference voltage first select switching portion 21. Vh2 or Vc2 is selected from the Vref[0, . . . , $2^{N/2}-1$] input by MSB[0, . . . , $2^{N/2}-1$] signals and output through the first reference voltage second select switching portion 22.

At this time, if Vh1 is selected and output from the first reference voltage first select switching portion 21, Vh2 is selected and output from the first reference voltage first select switching portion 22. If Vc1 is selected and output from the first reference voltage first select switching portion 21, Vc2 is selected and output from the first reference voltage second select switching portion 22.

The selected first reference voltages Vh1 and Vh2 or Vc1 and Vh2 are divided into $2^{N/2}$ by the resistor string block 23. Since the first reference voltages are all overlapped, Vh[0, . . . , $2^{N/2}-1$] level voltages, Vc[0, . . . , $2^{N/2}-1$] level voltages, and Vl[0, . . . , $2^{N/2}-1$] level voltages are all output from the resistor string block 23. However, one voltage is actually used for analog conversion. For example, if Vh1 and Vh2 are applied, the Vh[0, . . . , $2^{N/2}-1$] has a desired output value and the other Vc[0, . . . , $2^{N/2}-1$] and Vl[0, . . . , $2^{N/2}-1$] have the output values which are not used for analog conversion.

The Vh[0, . . . , $2^{N/2}-1$], Vc[0, . . . , $2^{N/2}-1$] and Vl[0, . . . , $2^{N/2}-1$] output from the resistor string block 23 are respectively output as the first, second and third analog conversion voltages V1, V2 and V3 by the second reference voltage first, second and third select switching portions 24, 25 and 26.

In other words, one of the Vh[0, . . . , $2^{N/2}-1$] voltage values output from the resistor string block 23 is selected through the second reference voltage first select switching portion 24 by the LSBb[0, . . . , $2^{N/2}-1$] and output as the first analog conversion voltage V1. Also, one of the Vc[0, . . . , $2^{N/2}-1$] voltage values output from the resistor string block 23 is selected through the second reference voltage second select switching portion 25 by the LSBb[0, ..., $2^{N/2}-1$] and LSB[0, ..., $2^{N/2}-1$] and output as the second analog conversion voltage V2. Further, one of the V1[0, ..., $2^{N/2}-1$] voltage values output from the resistor string block 23 is selected through the second reference voltage third select switching portion 26 by the LSBE[0, ..., $2^{N/2}-1$] and output as the third analog conversion voltage V3.

One of the first, second and third analog conversion values V1, V2 and V3 is output as a desired output value. In other words, one of the first, second and third analog conversion voltages V1, V2 and V3 are selectively output as an analog conversion value through the output switching portion 27 by combination of MSBb<0>, MSBb<$2^{N/2}-1$>, MSB<0>, and MSB<$2^{N/2}-1$>.

The output condition of the analog conversion value from the output switching portion 27 is as follows.

Output value=
  if (MSBb<$2^{N/2}-1$>'0') then V1
  else if (MSB<0>='1') then V3
  else V2.

When Vh1 and Vh2 are applied to the resistor string block 23, the output voltage ratio is as follows.

It is assumed that 3 bits in N=6 bits are the LSB and on resistor Ron of the transistor of each switching block is the same as the resistor value R of the resistor string block 23. In this case, it is noted that Vh<0>:Vh<1>:Vh<2>:Vh<3>:Vh<4>:Vh<5>:Vh<6>:Vh<7>=1:1:1:1:1:1:4:7.

When Vc1 and Vc2 are applied to the resistor string block 23, the output voltage ratio of Vc[0,1, ..., 7] is Vh<0>:Vh<1>:Vh<2>:Vh<3>:Vh<4>:Vh<5>:Vh<6>:Vh<7>=7:4:1:1:1:1:1:1.

When Vh1 and Vh2 are applied to the resistor string block 23, the output voltage ratio of V1[0,1, ..., 7] is V1<0>:V1<1>:V1<2>:V1<3>:V1<4>:V1<5>:V1<6>:V1<7>=7:4:1:1: 1:1:1:1.

As aforementioned, the output voltage ratio of the resistor sting is adjusted by the number of the resistors. Thus, the present invention provides a digital-to-analog converter having non-linear output value at a small number of the resistors. In the digital-to-analog converter of the present invention, various linear outputs can be achieved by adjusting the number of the resistors.

The non-linear digital-to-analog converter of the present invention has the following advantages.

First, since it is possible to design the converter at a small number of the resistors, the size of the converter can be reduced. In addition, since the output voltage ratio is adjusted by the number of the resistors constituting the resistor string, the non-linear digital-to-analog converter having correct conversion value can be provided.

It will be apparent to those skilled in the art that various modifications and variations can be made in the non-linear digital-to-analog converter according to the present invention without departing from the spirit or scope of the invention. Thus, it is intended that the present invention covers the modifications and variations of the invention provided they come within the scope of the appended claims and their equivalents.

What is claimed is:

1. A non-linear digital-to-analog converter comprising:

a first reference voltage select switching portion for selectively outputting first and second reference voltages Vh1 and Vc1 from externally applied reference voltages Vref[1, ... $2^{N/2}$] and third and fourth reference voltages Vh2 and Vc2 from externally applied reference voltages Vref[0, ... $2^{N/2}-1$] if N bit digital value is input;

a resistor string block for outputting Vh[0, ... $2^{N/2}-1$] number of level voltages, Vc[0, ... $2^{N/2}-1$] number of level voltages, and V1[0, ... $2^{N/2}-1$] number of level voltages from any one of the reference voltages Vh1 and Vc1 and any one of the reference voltages Vh2 and Vc2;

a second reference voltage select switching portion for outputting a first analog conversion voltage V1 from the Vh[0, ... $2^{N/2}$] number of level voltages, a second analog conversion voltage V2 from the Vc[0, ... $2^{N/2}-1$] number of level voltages, and a third analog conversion voltage V3 from the V1[0, ... $2^{N/2}-1$] number of level voltages; and an output switching portion for selectively outputting any one of the first, second and third analog conversion voltages V1, V2 and V3.

2. The non-linear digital-to-analog converter as claimed in claim 1, wherein the first reference voltage select switching portion includes a first reference voltage first select switching portion for selectively switching externally applied reference voltages Vref[1, ... $2^{N/2}$] for analog conversion of N bit digital value by MSBb[0, ... $2^{N/2}-1$] signals to output the first or second reference voltage Vh1 or Vc1, and a first reference voltage second select switching portion for selectively switching externally applied reference voltages Vref[0, ... $2^{N/2}-1$] by MSB[0, ... $2^{N/2}-1$] signals to output the third or fourth reference voltage Vh2 or Vc2.

3. The non-linear digital-to-analog converter as claimed in claim 2, wherein the first reference voltage second select switching portion outputs Vh2 to the resistor string block if the first reference voltage first select switching portion outputs Vh1 to the resistor string block, and the first reference voltage second select switching portion outputs Vc2 to the resistor string block if the first reference voltage first select switching portion outputs Vc1 to the resistor string block.

4. The non-linear digital-to-analog converter as claimed in claim 1, wherein the resistor string block includes a plurality of resistors connected in series and output lines formed between each of the resistors to divide input voltages into $2^{N/2}$, so that output lines of Vh[0, ... $2^{N/2}-1$], Vc[0, ... $2^{N/2}-1$], and V1[0, ... $2^{N/2}-1$] are overlapped.

5. The non-linear digital-to-analog converter as claimed in claim 1, wherein the second reference voltage select switching portion includes:

a second reference voltage first select switching portion for selectively outputting a first analog conversion voltage Vl from the Vh[0, ... $2^{N/2}-1$] number of level voltages by LSBb[0, ... $2^{N/2}-1$];

a second reference voltage second select switching portion for selectively outputting a second analog conversion voltage V2 from the Vc[0, ... $2^{N/2}-1$] number of level voltages by LSBb[0, ... $2^{N/2}-1$] and LSB[0, ... $2^{N/2}-1$]; and a second reference voltage third select switching portion for selectively outputting a third analog conversion voltage V3 from the V1[0, ... $2^{N/2}-1$] number of level voltages by LSB[0, ... $2^{N/2}-1$].

6. The non-linear digital-to-analog converter as claimed in claim 1, wherein the output switching portion selectively outputs any one of the first, second and third analog conversion voltages V1, V2 and V3 by combination of MSBb<0>, MSBb<$2^{N/2}$–1>, MSB<0>, MSB<$2^{N/2}$–1>.

7. The non-linear digital-to-analog converter as claimed in claim 6, wherein the output switching portion includes:

a PMOS transistor selectively turned on/off by MSBb<$2^{N/2}$–1> applied to its gate, for selectively outputting the first analog conversion voltage V1;

a first transmission gate selectively turned on/off by MSBb<$2^{N/2}$–1> applied to the gate of the PMOS transistor and MSB<$2^{N/2}$–1> applied to a gate of an NMOS transistor, for selectively outputting the second analog conversion voltage V2;

a second transmission gate connected to an output terminal of the first transmission gate, for selectively outputting an output signal of the first transmission gate by MSBb<0> applied to the gate of the PMOS transistor and MSB<0> applied to the gate of the NMOS transistor; and an NMOS transistor turned on/off by MSB<0> applied to the gate, for selectively outputting the third analog conversion voltage V3.

\* \* \* \* \*

UNITED STATES PATENT AND TRADEMARK OFFICE
CERTIFICATE OF CORRECTION

PATENT NO. : 6,181,265 B1
DATED : January 30, 2001
INVENTOR(S) : Lee

Page 1 of 1

It is certified that error appears in the above-identified patent and that said Letters Patent is hereby corrected as shown below:

Column 8, claim 1,
Line 13, change "$Vh[0,...2^{N/2}],$" to -- $Vh[0,...2^{N/2}-1]$ --.

Column 8, claim 2,
Line 27, change "voltage" to -- voltages --;
Line 31, change "voltage" to -- voltages --;
Line 31, change "or" to -- and --.

Signed and Sealed this

Twenty-ninth Day of January, 2002

Attest:

Attesting Officer

JAMES E. ROGAN
*Director of the United States Patent and Trademark Office*